April 28, 1970 E. MROZ 3,509,430

MOUNT FOR ELECTRONIC COMPONENT

Filed Jan. 31, 1968

INVENTOR.

EDWARD MROZ

BY Townsend & Townsend

ATTORNEYS

United States Patent Office 3,509,430
Patented Apr. 28, 1970

3,509,430

MOUNT FOR ELECTRONIC COMPONENT

Edward Mroz, Menlo Park, Calif., assignor to Micro Science Associates, Mountain View, Calif.

Filed Jan. 31, 1968, Ser. No. 702,004
Int. Cl. H01l 1/14
U.S. Cl. 317—234 8 Claims

ABSTRACT OF THE DISCLOSURE

A mount for hermetically housing an electronic component, such as an integrated circuit chip, wherein the body of glass-like heat conducting material having dielectric properties and high-strength characteristics is provided with a hollow interior for receiving the component to be mounted. The body has means defining an annular, recessed flange surrounding the entrance to its hollow interior and a lid is inserted in the recess of the flange for closing the body with the component therewithin. A eutectic member between the flange and the lid is heated and caused to move upwardly by capillary action into the region between the lid and the flange-defining means to provide a hermetic seal at the outer periphery of the lid.

This invention relates to improvements in the housing and supporting of electronic components and, more particularly, to structure for mounting a small, wafer-like electronic element, such as an integrated circuit chip or a hybrid circuit element.

The mounting of electronic components of the type described present a number of problems where it is desired that the components be hermetically sealed and protected against such things as ionizing radiations and shock and vibration forces. Attempts have been made in the past to overcome these problems and to provide an inexpensive amount of simple and rugged construction and one capable of relatively rapid heat dissipation. While such attempts may have been partially successful, they have generally not met all of the problems satisfactorily to assure hermeticity while providing the necessary mechanical strength, heat dissipation and simplicity of manufacture and assembly.

The present invention provides an improved mount for an electronic component which overcomes the above-mentioned problems by providing a construction having a relatively few number of parts, an improved hermetic seal, and a configuration permitting relatively rapid assembly even though the parts may be of relatively small size. The invention is also directed to a construction which provides optimum mechanical strength for the mount while permitting a number of electrical leads to extend into and out of the main body of the mount for connection to the electronic component therewithin. The construction is such that the main body of the mount has dielectric properties to provide the necessary insulation between such leads while, at the same time, the main body has a thermal conductivity sufficient to permit it to conduct the heat generated by the operation of the component to a heat sink without an additional metal-to-glass interface. To this end, the main body is formed from an aluminum loaded, hybrid glass material which, while having dielectric properties, is heat conducting to effect heat dissipation therefrom to a heat sink in contact therewith. Thus, the main body can be directly connected to mounting structure which forms the heat sink.

A further feature of the invention with respect to its simplicity of construction is the provision of means defining a flange for the main body for positioning a lid which closes the hollow interior of the body. The closure is completed by a eutectic member between the flange and the lid which, when heated, flows by capillary action into an upwardly extending space formed between the lid and the flange-defining means. The eutectic member, after it sets, forms a hermetic seal between the lid and the main body. A seal formed in this manner avoids preforms which must conform to the shape of the region to be sealed. Moreover, this seal minimizes the amount of eutectic material needed to provide the sealing action and avoids having any flowable sealing material dropping onto the electronic component within the mount when the sealing operation occurs.

The primary object of this invention is, therefore, to provide a mount for housing and supporting an electronic component wherein the mount has an improved hermetic seal, a minimum number of parts, and has sufficient mechanical strength to withstand shock and vibration forces while providing sufficient protection against radiation and a means to dissipate heat generated by the component housed thereby.

Another object of the invention is to provide a mount of the type described wherein the main body of the mount is closed by a lid and sealed by a eutectic member flowable by capillary action between the main body and the lid to provide a hermetic seal as well as to avoid dropping the flowable eutectic onto the component within the main body.

A further object of the invention is the provision of a mount of the aforesaid character wherein the main body thereof has dielectric properties as well as heat interchange characteristics so that the component within the main body will be protected from ionizing radiations and the electrical leads passing through the main body will be electrically isolated from each other while, at the same time, the body may dissipate the heat generated therewithin due to the operation of the component housed thereby.

Other objects of this invention will become apparent as the following specification progresses, reference being had to the accompanying drawing for an illustration of the embodiment of the invention.

Figure 1:
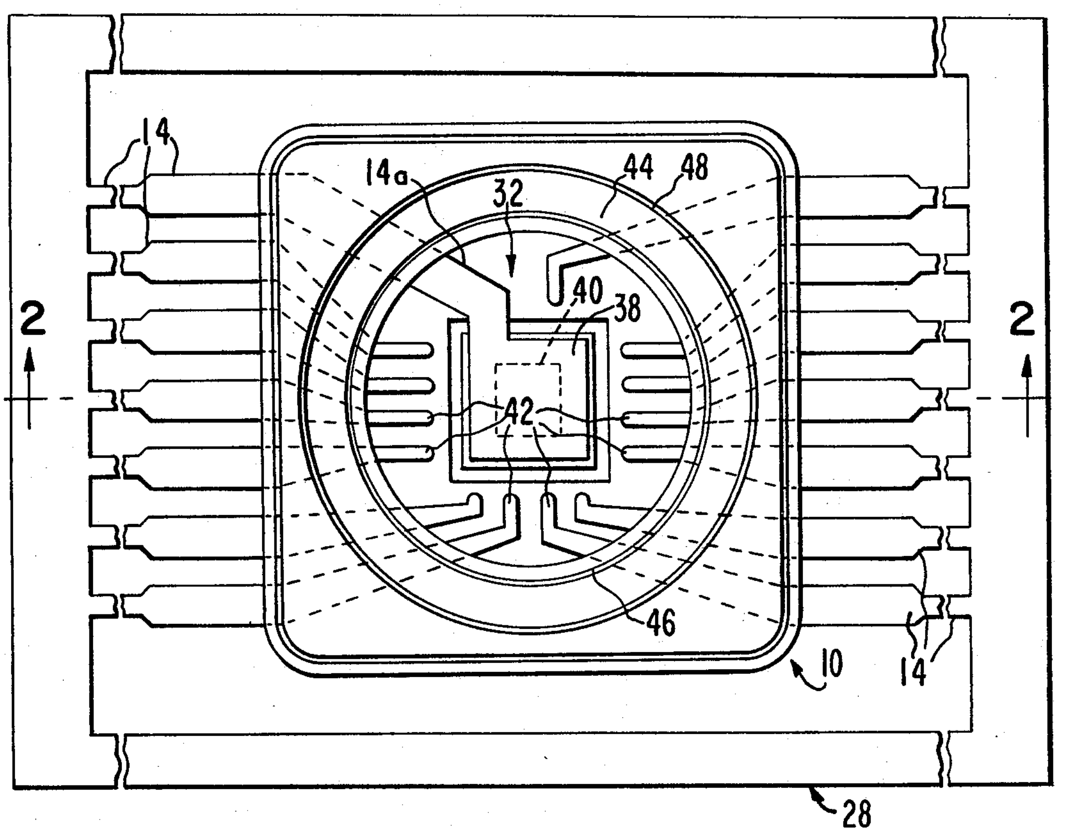
FIG. 1 is a top plan view of the mount with the lid removed therefrom.

The mount which forms the subject matter of this invention is broadly denoted by the numeral 10 and comprises a main body 12 having a plurality of electrical leads 14 extending therethrough, a flange-forming element 16 secured to body 12 at the upper face thereof, a lid 18 for closing the recess in body 12, and a eutectic member 20 disposed between element 16 and lid 18 to form a seal therebetween. Mount 10 is adapted for housing an electronic component of relatively small dimensions, such as in integrated circuit chip or a hybrid circuit element. The dimensions of mount 10 can be quite small so as to be commensurate in size with the electronic component housed thereby.

Main body 12 has a flat face 22 on which the flat surface 24 of element 16 is disposed. Body 12 is formed from a glass-like material having dielectric properties and provided with a thermal conductivity to permit heat dissipation therethrough. A material found to be especially adapted for this purpose is an aluminum loaded hybrid glass which has high mechanical strength. It also effectively insulates electrical leads 14 from each other since the aluminum material therewithin is aluminum oxide which is itself a dielectric. This glass-like material, because of its thermal conductivity, permits heat developed by the operation of the electronic component in the main body to be dissipated to a heat sink to which body 12 is coupled. The opposite face 26 of body 12 is flat so that it may be supported on or in engagement with a flat base which preferably is of a metallic or other material forming a heat sink.

Body 12 may be formed in any suitable manner, such as by a pair of upper and lower sections which are fused together by applying heat thereto after a lead frame, denoted by the numeral 28 in FIG. 1, has been placed between the sections. Frame 28 is of conventional construction and has leads 14 integral therewith, the outer portions of the frame being removable from the leads after the latter have been embedded in body 12.

Body 12 may be of any desired shape but, for purposes of illustration only, it is square as shown in FIG. 1. Moreover the body has an inner, continuous wall 30 which defines a recess 32 into which the electronic component is placed and which is covered by lid 18. The innermost surface 34 of recess 32 slopes inwardly toward the center and a cavity 36 is formed in surface 34 for receiving a pad 38 on the on the inner end of load 14*a*. An electronic component 40, shown in dashed lines on pad 38 in FIG. 1, is fixedly secured to the pad in any suitable manner. The pad is in contact with main body 12 so that heat can be conducted from component 40 through pad 38 and into body 12. The heat will then be dissipated by conduction to the heat sink to which body 12 is connected.

The other leads 14 have inner ends 42 which can be connected to component 40 by wires bonded thereto. Ends 42 terminate short of cavity 36 as shown in FIG. 1.

Figure 2:
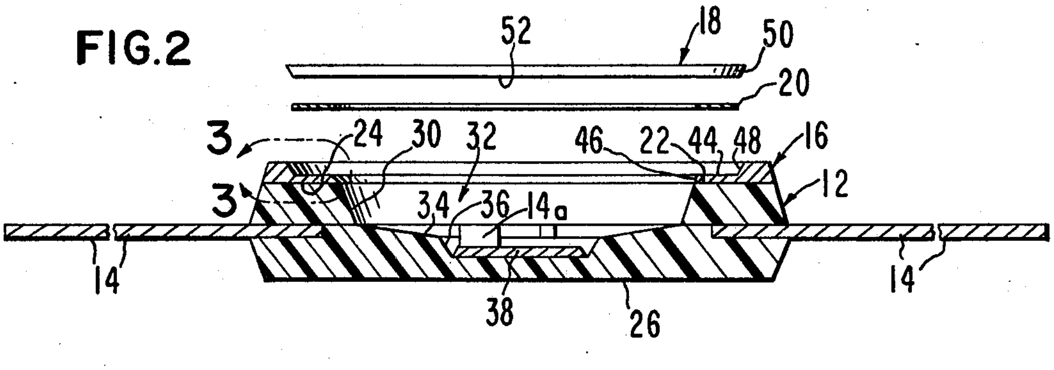
FIG. 2 is a cross-sectional view taken along line 2—2 of FIG. 1 and illustrating the lid and the eutectic member above the main body of the mount.

Element 16 has a generally flat recessed face 44 whose inner periphery 46 is flush with surface 30 defining recess 32. A sloping surface 48 extends outwardly and away from the outer peripheral margin of flat surface 44 so that the latter, when it is horizontally disposed as shown in FIG. 2, defines a flange for supporting member 20 and lid 18 thereabove. Element 16 is formed from a suitable metallic material and is bonded by a typical metal-to-glass seal to the upper face 22 of body 12.

Eutectic member 20 is annular to define a washer-like configuration. It has an inner diameter and an outer diameter substantially equal to the inner and outer peripheral margins of flat surface 44.

Lid 18 is used to clase the opening in body 12 which leads to its hollow interior. The thickness of the lid is approximately equal to the depth of surface 44 in element 14. Lid 18 also has an annular, outer peripheral end face 50 substantially complemental to surface 48 of element 16 and is receivable within element 16 and is supported on member 20 so that there is a small annular region or space between surface 48 and outer lid face 50.

Figure 3:
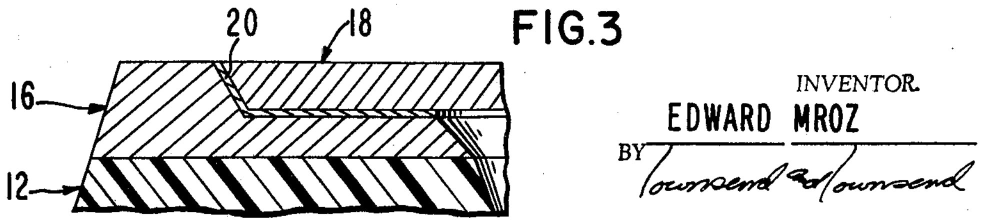
FIG. 3 is an enlarged, fragmentary, cross-sectional view of the mount looking in the vicinity of line 3—3 of FIG. 2 and illustrating the seal obtained by capillary action.

Member 20 is formed from a fusible material, such as a gold-tin alloy and the geometry of element 16 and lid 18 provides for the flow of the compound by capillary action into the space between surfaces 48 and 50 when member 20 is heated to a temperature sufficient to cause it to be flowable. The member, thus, fills this annular space and, when the alloy sets to a hardened condition, it forms a hermetic seal (FIG. 3) which is uniform throughout the annular extent of this space. The seal is not only at the junction between surface 48 and face 50 but is at the junction between the flat surface 44 and the inner face 52 of lid 18. The aforesaid seal provides hermeticity for mount 10 and allows the dimensions of the latter to remain substantially small. The formation of this seal does not affect the glass-to-metal seal between body 12 and element 16.

Since the flow of the eutectic by capillary action is away from the interior of body 12, the flowable eutectic material is essentially prevented from dropping into recess 32 and onto component 40 therewithin. This protects the component and assures its monolithic character notwithstanding the improved hermetic seal provided by member 20 in the manner described above.

The resulting package for component 40 provides protection against radiation and ionization of the internal atmosphere of mount 10. The structural properties of body 12 provide the necessary mechanical strength to withstand shock and vibration forces of relatively high magnitudes. Moreover, the heat conducting properties of body 12 provides for rapid dissipation of heat from component 40 while eliminating the need for a metallic base and thereby a second metal-to-glass seal.

The construction of mount 10 provides a simple jig for mounting lid 18 to thereby avoid the necessity for jig structure external to the mount. This minimizes assembly casts and avoids improper mounting of the lid. The construction of the mount also assures that electrostatic forces in the vicinity of the mount will not crack component 40 therewithin.

While one embodiment of this invention has been shown and described, it will be apparent that other adaptations and modifications of this device can be made without departing from the true spirit and scope of the invention.

I claim:

1. A component mount comprising: a body having a hollow interior for receiving a component to be mounted and provided with an opening permitting access to said hollow interior, said body being formed from a dielectric material capable of conducting heat therethrough; means defining a flange on said body in encircling relationship to said opening and a surface extending away from one margin of the flange, said surface extending upwardly from the flange when the body is in a predetermined position; a lid movable into a location across said opening and along said surface for closing the opening; and a eutectic member between the lid and said flange, said member being flowable between said surface and the lid by capillary action when the member is heated and as the member is disposed in said position, whereby the eutectic member defines a seal between the lid, the flange and the surface.

2. A mount for an electronic component comprising: a body having a hollow interior and an opening providing access to said interior, said body adapted to receive therewithin an electronic component to be mounted; said body being formed from a dielectric material having a thermal conductivity, said body having means thereon for defining a flange in surrounding relationship to said opening and a continuous surface adjacent to one margin of the flange; a lid disposed adjacent to the flange in closing relationship to the opening with the lid having a peripheral portion extending along said surface; a eutectic member between the lid, the flange and said surface to provide a seal therefor, said member initially having a washer-like configuration and flowable by capillary action between said surface and said peripheral portion of the lid when the member is disposed between the flange and the lid and when said surface extends upwardly from said flange; and a plurality of electrical leads extending through the body for electrical connection with the component therewithin.

3. A mount for an electronic component comprising: a body having a hollow interior and upper face provided with an opening permitting access to said interior, said body adapted to receive therewithin an electronic component to be mounted, the body being formed from a dielectric material capable of conducting heat therethrough; means on the upper face of said body for defining a recessed flange in surrounding relationship to said opening, said means having a continuous surface extending upwardly from the outer margin of the flange; a eutectic member supported on the flange and surrounding said opening; a lid movable into the recess of the flange and onto said member for closing said opening, said lid having a peripheral end face adjacent to said surface, said member being flowable between said end face of the lid and said surface by capillary action when the member is heated to a predetermined temperature whereby the member defines a seal between the lid and said flange-defining means; and a plurality of spaced electrical leads extending through the body for connection with the component therewithin.

4. A mount as set forth in claim 3, wherein said flange-defining means comprises a metallic element upper face of the body and the lower face of the element being flat and in juxtaposition with each other.

5. A mount as set forth in claim 3, wherein said material comprises aluminum loaded hybrid glass.

6. A mount as set forth in claim 3, wherein the end face of said lid is substantially complemental to the surface of the flange-defining means.

7. A mount as set forth in claim 3, wherein each lead comprises a flat, bendable section exteriorly of the body.

8. A mount as set forth in claim 3, wherein one of the leads has a pad within said cavity and disposed to support said electronic component, said pad being in contact with said body.

References Cited

UNITED STATES PATENTS 3,312,771 4/1967 Hessinger et al. ------ 174—52

JOHN HUCKERT, Primary Examiner

R. F. POLISSACK, Assistant Examiner

U.S. Cl. X.R.

174—50.5, 50.55, 52; 317—235